United States Patent
Toporski et al.

(10) Patent No.: US 7,043,215 B2
(45) Date of Patent: May 9, 2006

(54) METHOD OF PERFORMING A FAST TUNE FOR A DIGITAL BROADCAST STATION IN A RADIO RECEIVER

(75) Inventors: Todd A. Toporski, Northville, MI (US); J. William Whikehart, Novi, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 523 days.

(21) Appl. No.: 10/441,132

(22) Filed: May 19, 2003

(65) Prior Publication Data

US 2004/0235440 A1   Nov. 25, 2004

(51) Int. Cl.
*H04B 17/02*   (2006.01)

(52) U.S. Cl. .............................. 455/186.1; 455/184.1; 455/154.1; 455/161.1

(58) Field of Classification Search ................ 455/130, 455/132, 161.1, 166.2, 150.1, 154.2, 179.1, 455/184.1, 158.1, 186.1

See application file for complete search history.

(56) References Cited

U.S. PATENT DOCUMENTS

| | | | | |
|---|---|---|---|---|
| 5,457,815 A | * | 10/1995 | Morewitz, II | 455/161.1 |
| 5,584,051 A | | 12/1996 | Goken | |
| 5,898,910 A | * | 4/1999 | Miyake et al. | 455/186.1 |
| 6,246,672 B1 | | 6/2001 | Lumelsky | |
| 6,912,378 B1 | * | 6/2005 | Morewitz et al. | 455/150.1 |
| 2004/0110522 A1 | * | 6/2004 | Howard et al. | 455/512 |

FOREIGN PATENT DOCUMENTS

| | | |
|---|---|---|
| EP | 0946011 | 9/1999 |
| EP | 0961431 | 12/1999 |
| EP | 1022873 | 7/2000 |

\* cited by examiner

*Primary Examiner*—Edward F. Urban
*Assistant Examiner*—Blane J. Jackson
(74) *Attorney, Agent, or Firm*—MacMillan, Sobanski & Todd, LLC (57) ABSTRACT

A radio receiver performs a fast tune to a target frequency channel potentially containing a hybrid broadcast signal for determining whether analog signal contained in the hybrid broadcast signal contains an identifying data indicating the presence of a digital broadcast station before attempting to decode a digital signal contained in the hybrid broadcast signal.

23 Claims, 6 Drawing Sheets

| Station Index | Broadcast Type | Station Location | Station Call Letter | Station Alias | Genre | Program Format |
|---|---|---|---|---|---|---|
| 1 Byte | 2 Bits | 4 Bytes | 2 Bytes | 2 Bytes | 1 Bytes | 1 Bit |

METHOD OF PERFORMING A FAST TUNE FOR A DIGITAL BROADCAST STATION IN A RADIO RECEIVER

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

1. Field of the Invention

The present invention relates in general to digital audio broadcasting, and more specifically, to a method for performing a fast tune for a digital broadcast station in a radio receiver.

2. Description of the Related Art

With the introduction of terrestrial digital audio broadcasting, a radio listener has the opportunity to experience a higher quality of broadcast reception utilizing a digital broadcast as opposed to a traditional analog broadcast. Improved reception, better audio quality, and data services are some of the benefits of using digital audio broadcasting.

To receive the full benefits of digital audio broadcasting, listeners must have a digital audio receiver to receive the digital audio broadcast. Therefore, there will be a transition period as listeners migrate from analog audio receivers to digital audio receivers. During the transition period, if a broadcast station wants to maintain their listening audience, the broadcast station must transmit both a digital broadcast for those listeners who are capable of receiving the digital broadcast and transmit an analog broadcast for those listeners who are still utilizing the analog audio receiver.

A method of broadcasting both the digital signal and the analog signal a frequency range for a particular audio broadcast station has recently become available. In-Band On Channel (IBOC) is a system that is capable transmitting a hybrid signal. IBOC transmits the analog signal on a center portion of the frequency range with the digital signal occupying an upper and lower side portion of the frequency range.

An advantage with digital audio broadcasting is that the digital signal contains auxiliary program data, station identification information, or other information in addition to digital audio. The station identification information and auxiliary program data is useful in informing the listener as to the content of the broadcast signal without the listener having to wait to listen to a received broadcast to determine the contents thereafter. The digital signal contains, in part, a plurality of subcarriers each containing digital information representative of program data transmitted by the IBOC station. Information such as station identification (e.g., call letters), song title, artist, genre, and album are some of the information that can be quickly referenced by the listener. However, decoding and outputting the digital signal to the listener may be more timely than decoding and outputting an analog signal due to the complex decoding that is performed on audio and data subcarriers of the digital signal.

A lookup table stored in the receiver may be used to quickly obtain information on a broadcast station without having first received the audio broadcast signal from the broadcast station. The lookup table would contain station related information regarding a specific broadcast station such as station identification, genre, broadcast type, station location, station alias name, program format, and other related information that is not dependent upon a song selection currently being broadcast by the IBOC station. The lookup table would be constructed for a respective broadcast region that the receiver has been updated for. The frequency range or channel of the broadcast is used to index the lookup table to retrieve and display the station related information without having to decode the digital signal. A lookup table can be constructed or rebuilt automatically by the receiver or manually by a listener. An example of how the lookup table could be created or rebuilt is by using a scan function. Once the scan function is initiated, the receiver will scan through a broadcast band looking for digital broadcast stations transmitting a digital signal. When the receiver determines that a frequency range or channel is broadcasting a digital signal, the receiver will store the station related information for the digital broadcast station at a table entry in the lookup table. Each table entry in the lookup table will be associated with a respective frequency range or channel of a respective digital broadcast station. The lookup table could be used compare the identification codes of the lookup table with the identification codes of the received digital signal to verify that a digital broadcast station is present on the target frequency channel.

Since the lookup table is constructed for a specific geographical region, a listener cannot rely solely on the lookup table to verify the presence of a digital broadcast station for a target frequency channel because of the receiver being moveable in and out of various geographical locations. Additionally, when the listener performs a scan, seek, or tune operation to the target frequency channel of the digital broadcast station, the time to decode and produce the digital signal is longer than the time to decode and produce an analog signal containing information identifying the station as the digital broadcast station. It would be desirable to perform a fast tune operation for making a determination of whether the target frequency channel contains a digital data signal without having to decode the digital signal.

SUMMARY OF THE INVENTION

Consonant with the present invention, a method of performing a fast tune to a target frequency channel potentially containing a hybrid broadcast signal for determining whether an analog signal contained in the hybrid broadcast signal contains an identifying data indicating the presence of a digital broadcast station prior to receiving a digital signal to determine whether a digital station is present.

In one aspect of the invention, a method is performed using a fast tune in a radio receiver for a hybrid broadcast station, wherein the hybrid broadcast station provides an audio broadcast signal. The audio broadcast signal contains both analog signal and a digital signal at a target frequency channel. The receiver includes a tuner for selecting the frequency range of the hybrid broadcast station, a digital decoder for decoding the digital signal, and an analog decoder for decoding the analog signal. The analog signal may contain an identifying data and the digital signal will contain an identifying data indicating a station and programming content of the audio broadcast signal. The method comprises the steps of identifying the frequency channel to potentially receive the hybrid broadcast station. The receiver is tuned to the target frequency channel. The identifying data is retrieved from the analog signal if the analog signal is present. A determination is made whether a digital broadcast station is present in response to identifying data. The receiver is tuned to a next successive target frequency channel when the identifying data of an analog or digital signal is not present.

DETAILED DESCRIPTION OF PREFERRED EMBODIMENTS

Figure 1:
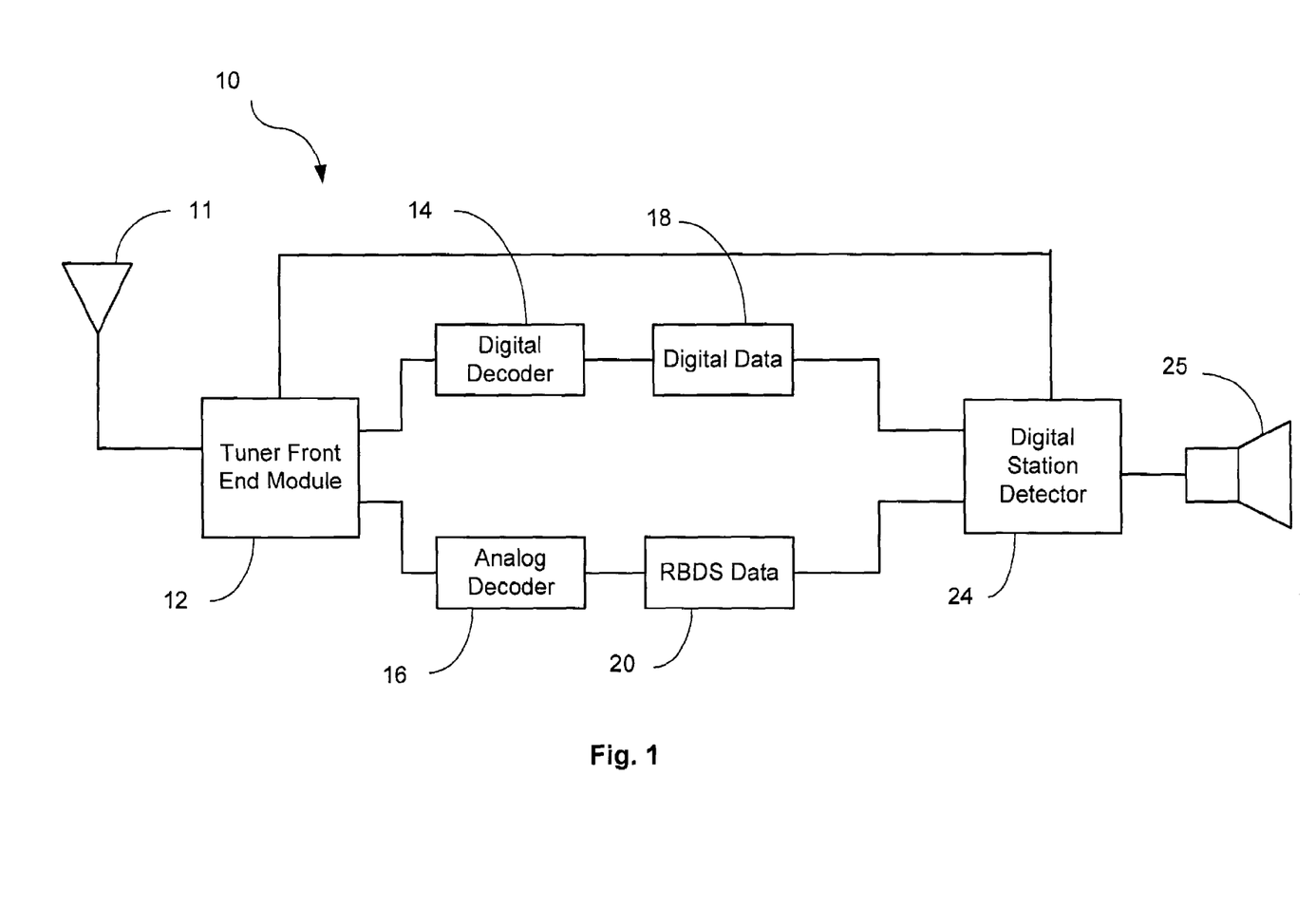
FIG. 1 is a block diagram of a receiver for performing a fast tune for a digital broadcast station according to a preferred embodiment.

Referring now to the Drawings and particularly to FIG. 1, there is shown a block diagram of a radio receiver used to determine whether a target frequency channel is providing a digital signal. A receiver 10 comprises an antenna 11 for receiving an audio broadcast signal, such as an IBOC signal, from an audio broadcast station. The IBOC signal comprises the digital signal (primary channel) and an analog signal (backup channel) over a frequency range for a particular audio broadcast station. The analog signal is transmitted on a center band of the frequency range while the digital signal occupies upper and lower sideband portions of the frequency range. The antenna 11 is connected to an input of a tuner front end module 12 capable of selecting a frequency range broadcasting of the IBOC signal. The tuner front end module 12 includes a local oscillator, a mixer for mixing received audio broadcast signal with the local oscillator, a bandpass filter and an analog to digital converter. One or more tuners may be used to process the analog and digital signal over the frequency range. The receiver 10 can include a control option for performing a seek, scan, or tune operation for 1) stopping at any station, 2) stopping only at a digital station, or 3) stopping at a station with a certain format.

A digital demodulator/decoder 14 is connected to the tuner front end module 12 for decoding the digital signal containing a digital data 18. The digital data 18 includes identification codes relating to the station and programming content of the digital broadcast station as well as the audio signal. Identification codes relating to the station and programming content of the digital broadcast station may be included in the analog signal by using Radio Broadcast Data System (RBDS) technology. RBDS uses various codes and features such as PTY (Program Type), PTYN (Program Type Name), PI (Program Identification), PS (Program Service) or ODA (Open Data Application) to provide information concerning station and programming content of the analog signal. An RBDS data 20 in the form of the PTY, PTYN, or other codes can be transmitted in the analog signal to indicate that the digital broadcast station provides the IBOC signal. An analog demodulator/decoder 16 is connected to the tuner front end module 12 for decoding the analog signal containing the RBDS data 20. The analog signal includes the audio signal and may also include the RBDS data 20 which contains the identification codes relating to the station and programming content of the digital broadcast station. The identification codes may comprise a broadcast type code which identifies the audio broadcast station as the digital broadcast station.

A digital station detector 24 receives the RBDS data 20 and the digital data 18 containing the identifying data and determines the presence of a digital broadcast station. If the digital broadcast station is determined to be present, then audio content of the audio broadcast signal will be output to a receiver unit 25 such as a speaker. If the digital broadcast station is not determined to be present during a digital scan, seek, or tunes then a next successive target frequency channel is tuned to determine if a digital broadcast station is present.

In the preferred embodiment, the digital station detector 24 is a microcontroller. In another embodiment, to decrease the time to determine if an IBOC station is present, the microcontroller can set time limits when decoding the audio broadcast signal. For example, the microcontroller can set a predetermined time limit of T1max to decode and determine if a digital broadcast station is detected on the analog signal, otherwise, a determination is made that the analog signal does not contain information indicating the presence of the digital broadcast station. In a similar manner, a time limit of T2max is set to determine if the audio broadcast signal contains a digital signal when performing a digital demodulation. Since a receiver 10 can decode an analog signal and determine if the IBOC signal is present faster than decoding the digital signal, the maximum allowable time limit to decode the analog signal can be shorter than the maximum allowable time limit for decoding the digital signal, (i.e., T1max is less than T2max). As a result, the analog decoding is completed first. However, because the analog signal does not always contain the RBDS data 20, the digital decoder may need to be inspected to determine the presence of the digital signal whenever the RBDS data 20 or the identification codes of the analog signal are not present.

Figure 2:
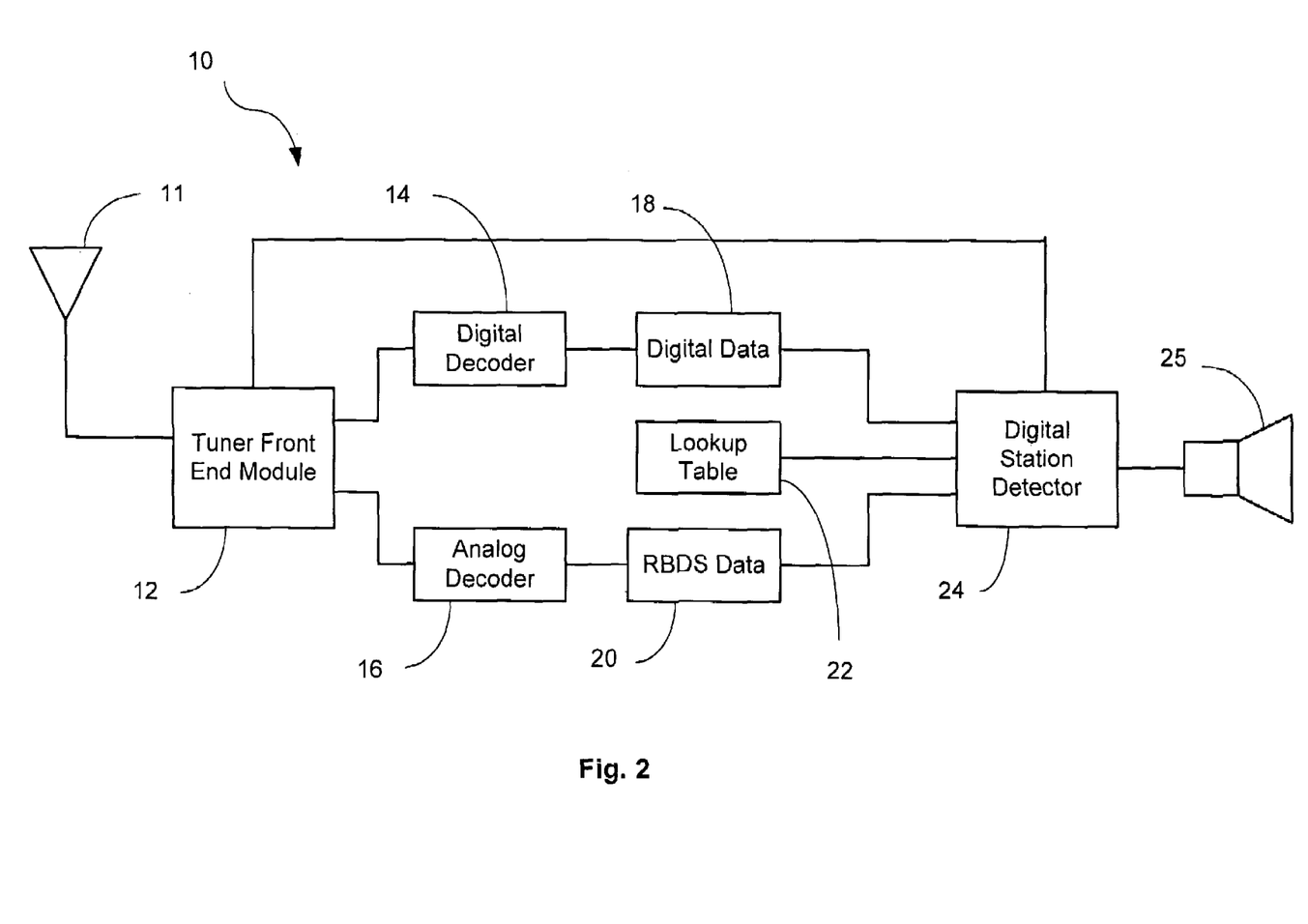
FIG. 2 is a block diagram of a receiver for performing a fast tune for a digital broadcast station according to a second preferred embodiment.

FIG. 2 illustrates a receiver incorporating a lookup table system to perform a fast tune according to a second preferred embodiment. A lookup table 22 is used to store the station identification codes and other programming codes related to a plurality of digital broadcast stations for a geographical region. The station identification codes are associated with a designated audio broadcast station for a designated geographical region. The lookup table is valid within the designated geographical region for the designated audio broadcast station. When traveling outside of the designated geographical region the lookup table can become invalid and require updating. Updating can occur automatically by the receiver or manually by prompting the listener to perform an update function.

The lookup table 22 contains a plurality of table entries for a broadcast band for frequencies allocated to a FM band and to an AM band. The plurality of table entries contain identification codes relating to the station or programming content for each audio broadcast station of a last updated lookup table and are indexed according to their allocated channel frequency. The identification codes represent a plurality of searchable information items relating to the station or programming content such as station identifiers, music genre, program formats (music or talk), special station services and many other useful types of information. The lookup table is stored in non-volatile memory, such as flash or battery-backed static ram (SRAM). Following a receiver power-up, the lookup table is loaded into scratch RAM where the lookup table may be updated at any time during the receiver operation. The table is only updated with local broadcasting stations. When the receiver is powered down or in standby mode, the updated data in the scratch RAM is written to the non-volatile memory locations.

In this embodiment, any of the plurality of searchable information can be used to determine if the audio broadcast signal contains information identifying a digital broadcast station. When decoding the analog signal, a specific identification code from the lookup table will be compared to a specific identification code from the RBDS data of analog signal by the digital station detector 24 to determine if the IBOC signal is present. As in the first preferred embodiment, the analog signal is decoded first to determine if the IBOC signal is present and time limits of T1max and T2max can be set for the analog demodulation and the digital demodulation, respectively, to expedite the determination process.

Figure 3A:
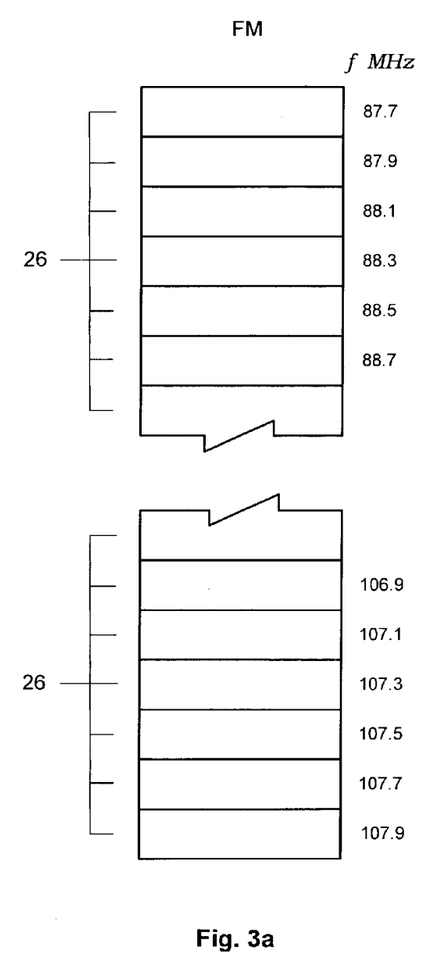
FIG. 3a is a lookup table for a FM broadcast band.
Figure 3B:
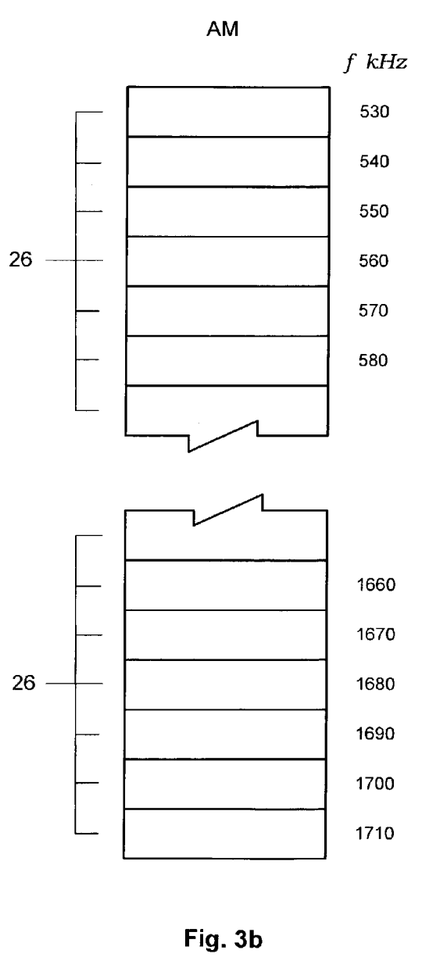
FIG. 3b is a lookup table for an AM broadcast band.

FIGS. 3a and 3b illustrates the lookup table for a broadcast band of a designated geographical location. FIG. 3a represents the lookup table for the broadcast band for frequencies allocated to a FM band and FIG. 3b represents the lookup table for the broadcast band for frequencies allocated to an AM band. The FM band ranges from frequencies 87.7 MHz–107.9 MHz. For the FM band, there are 101 allocated broadcast channels. The AM band ranges from frequencies 530 kHz–1710 kHz. For the AM band, there are 118 allocated broadcast channels.

Figure 4:
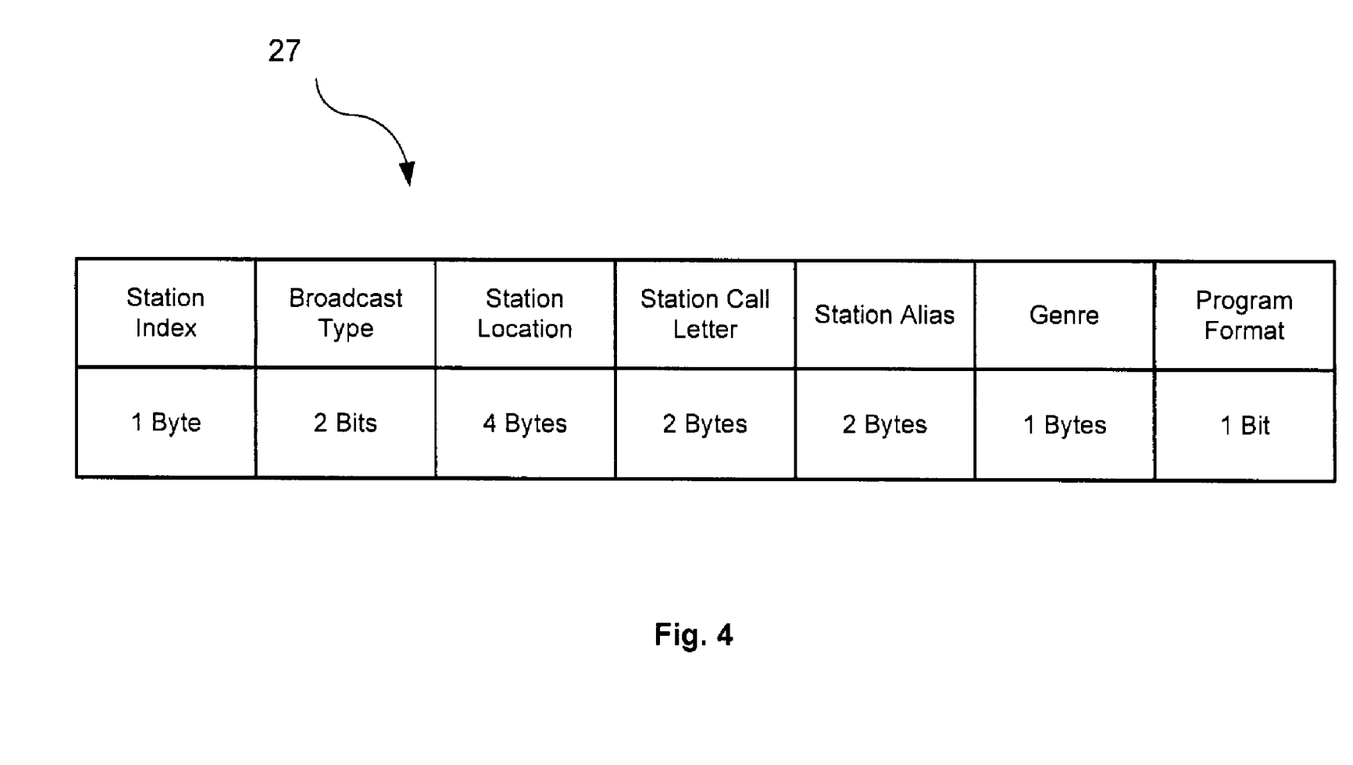
FIG. 4 is a table entry in a lookup table illustrating identification codes associated with a station and programming content of a digital audio broadcast signal.

FIG. 4 illustrates one table entry 27 in the lookup table 22. The table entry 27 contains identification codes regarding detailed information about the station and programming content of the digital audio signal. The table entry 27 containing identification codes are stored for each digital broadcast station contained in the lookup table 22 for the designated geographical location. Identification codes such as station index, broadcast type (all-digital, all-analog, hybrid), station location, station identification code, alias name, genre, and program format are only some of the identification codes that can be stored in a table entry. Each of the identification codes would be restricted to a set memory size based on the available memory of the receiver.

Figure 5:
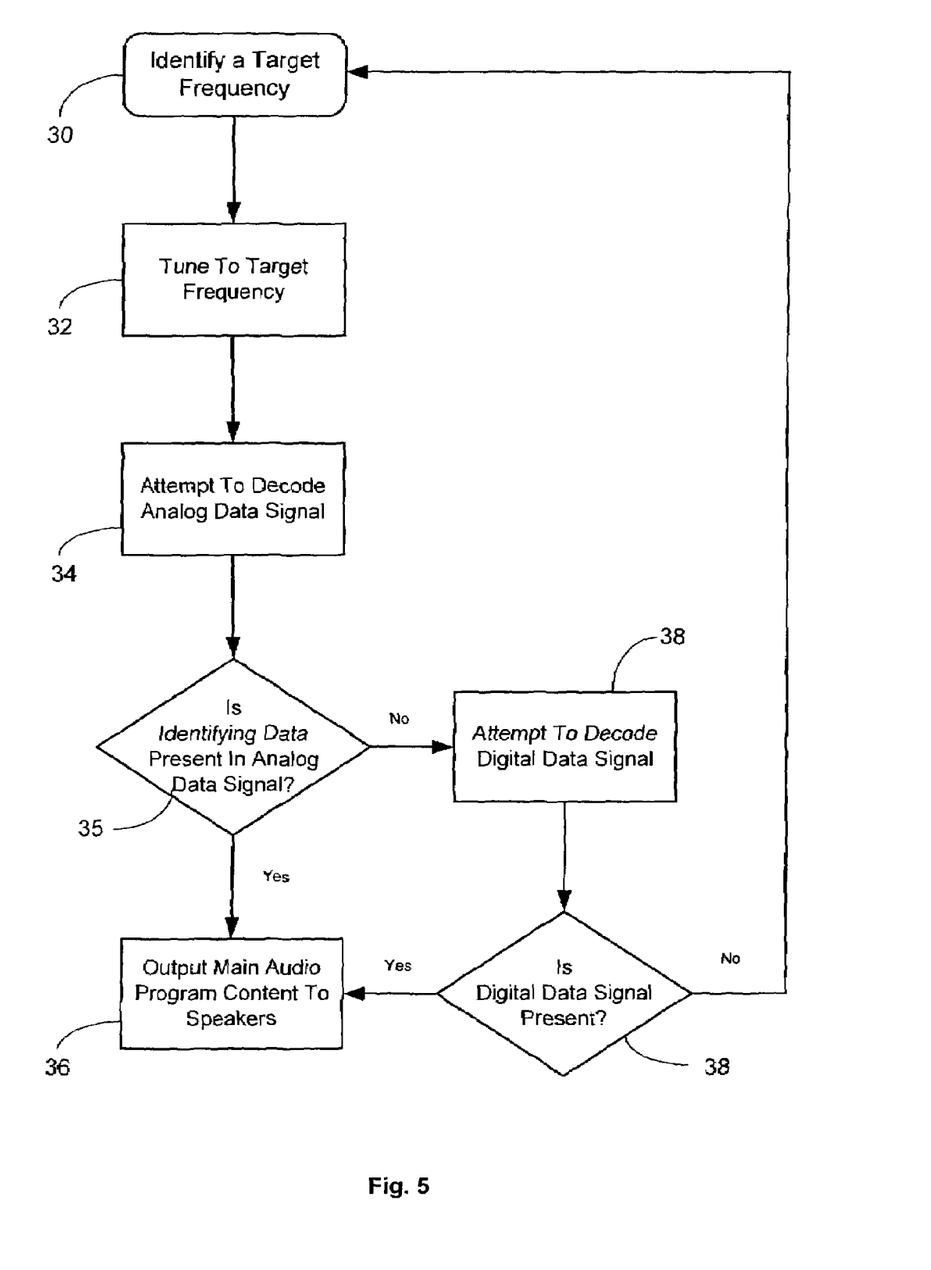
FIG. 5 is a flow diagram of a method to performing a fast tune operation for a digital broadcast station according to a first preferred embodiment.

FIG. 5 illustrates a flowchart of a fast tune operation to detect the presence of the digital broadcast station. In step 30, the target frequency channel is identified for potentially receiving said digital broadcast station wherein the digital broadcast station provides a hybrid signal comprising a digital signal containing digital data and an analog signal potentially containing RBDS data. In step 32, a listener performs a tune operation to the target frequency channel of the digital broadcast station broadcasting the hybrid signal. A tune operation includes any type of method used to select the frequency of the digital broadcast station such as seek functions, scan function, preset memory, or incrementing frequencies in the broadcast band. In step 34, the receiver attempts to decode the analog data signal potentially containing the RBDS data. In step 35, a determination is made whether an identifying data contained in the RBDS data is present indicating the presence of the digital broadcast station. This may comprise a special value in an existing RBDS field (e.g. the PTY field). In step 36, if the digital broadcast station is detected in response to receiving the identifying data from the RBDS data, then the target frequency channel includes a digital main audio program, any frequency scanning is stopped, and the program content is output to the speakers. If the identifying data is not present in step 35, then an attempt to decode and detect the digital signal is performed in step 38. If the digital signal is detected, then the target frequency channel includes a digital main audio program, any frequency scanning is stopped, and the program content is output to the speakers in step 36. If the digital signal is not detected in step 38, then the next successive target frequency is decoded to determine if a digital station is present.

Figure 6:
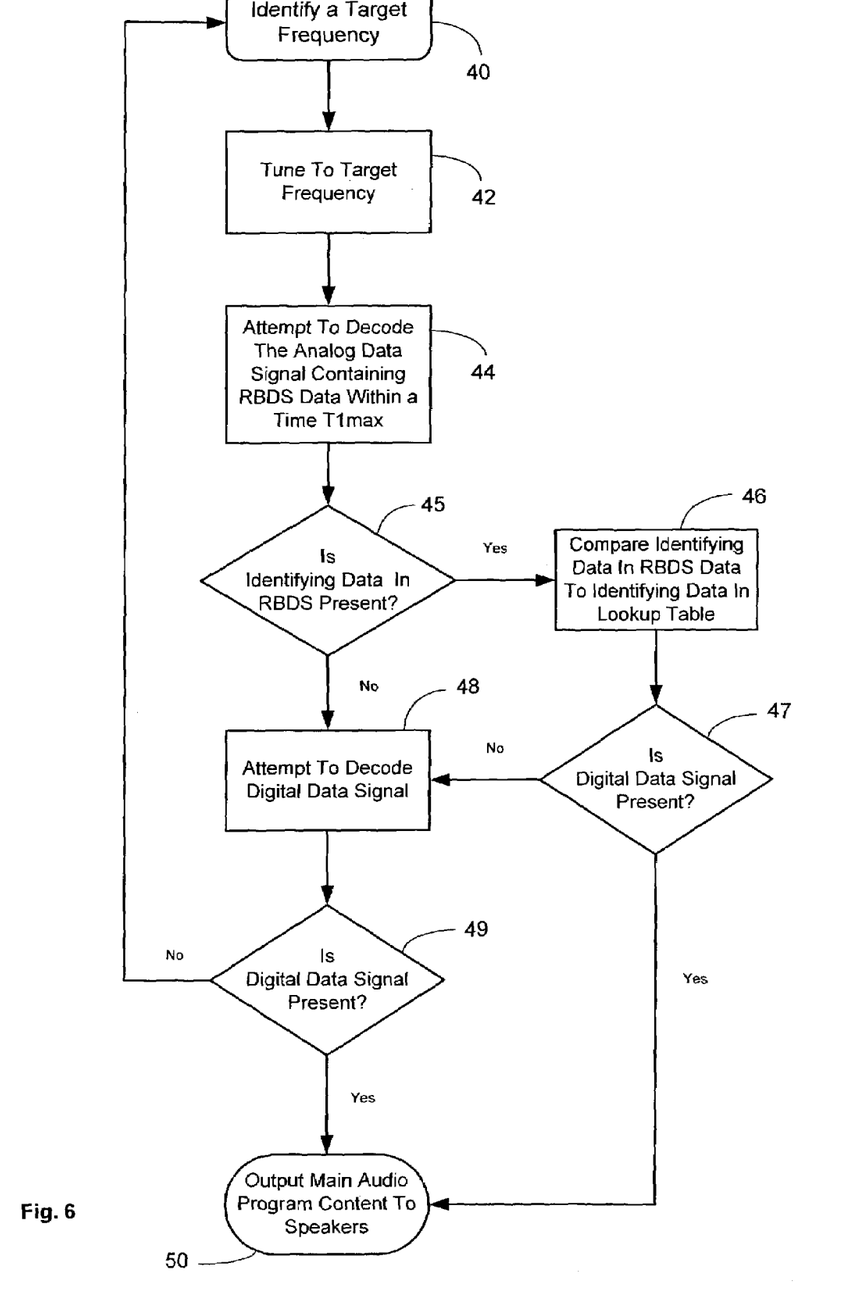
FIG. 6 is a flow diagram of a method to performing a fast tune operation for a digital broadcast station according to a second preferred embodiment.

FIG. 6 illustrates a flowchart of the fast tune operation for a second preferred embodiment wherein RBDS data may provide a generic identification of a station (e.g., call letters) but not identify a digital station directly. In step 40, the target frequency channel is identified for potentially receiving said digital broadcast station wherein the digital broadcast station provides a hybrid signal comprising a digital signal containing digital data and an analog signal potentially containing RBDS data. In step 42, a listener performs a tune operation to the target frequency channel of the digital station broadcasting the hybrid signal. A tune operation includes any type of method used to select the frequency of the digital broadcast station such as seek functions, scan function, preset memory, or incrementing frequencies in the broadcast band. In step 44, the receiver attempts to decode the analog signal and retrieve the identifying data contained in the RBDS data of the analog signal within the first predetermined period of time. In step 45, a determination is made whether the identifying data is retrieved within the first predetermined period of time. If the identifying data contained in the RBDS is retrieved as in step 44, then a comparison is made with the identifying data in the lookup table to determine if a match is present in step 46. If a match is present then it is determined that the target frequency channel includes a digital main audio program, any frequency scanning is stopped, and the program content is output to the speakers in step 50. If a match is not detected in step 46 or if the identifying data is not retrieved in step 44, then an attempt to decode and detect the digital signal is performed within the second predetermined period of time is step 48. In step 49, a determination is made whether the digital signal is present. If the digital signal is present in step 48, then the determination is made that the target frequency channel includes a digital main audio program, any frequency scanning is stopped, and the program content is output to the speakers in step 50. If it is determined that the digital broadcast signal is not detected in step 49, then the next successive target frequency is decoded to determine if a next digital station is present.

What is claimed is:

1. A method of performing a fast tune in a receiver for a hybrid broadcast station, wherein said hybrid broadcast station provides an audio broadcast signal at a target frequency channel, wherein said audio broadcast signal contains an analog data signal and a digital data signal, said receiver includes a tuner for selecting said frequency range of said hybrid broadcast station, a digital decoder for decoding said digital data signal and an analog decoder for decoding said analog data signal, wherein said analog data signal may contain an identifying data and said digital data signal contains said identifying data, wherein said identifying data relates to a station and programming content of said audio broadcast signal, said method comprising the steps of:

identifying said target frequency channel for potentially receiving said hybrid broadcast station;

tuning to said target frequency channel;

attempting to decode said analog data signal;

receiving said identifying data from said analog data signal when said analog data signal is present;

detecting a digital broadcast station in response to said identifying data from said analog data signal;

attempting to decode said digital data signal when said identifying data is not present in said analog data signal, wherein if said digital data signal is present, then said target frequency channel includes a digital main audio program; and repeating said foregoing steps using a next successive target frequency channel when neither identifying data of said analog or digital data signal are present.

2. The method of claim 1 further comprising the step of comparing said received identifying data from said analog data signal with a stored identifying data corresponding to said target frequency channel from a lookup table to determine whether a received signal on said target frequency channel includes said digital broadcast station selected.

3. The method of claim 1 wherein said receiving step further includes receiving said identifying data from said analog data signal within a first predetermined period of time.

4. The method of claim 3 wherein said attempting to decode digital data signal step is performed with a second predetermined period of time.

5. The method of claim 4 wherein said second predetermined time is greater than said first predetermined period of time.

6. The method of claim 1 wherein said received identifying data from said analog data signal comprises RBDS data.

7. The method of claim 1 wherein said identifying data comprises a station identification code.

8. The method of claim 7 wherein said station identification code comprises a station call letter.

9. The method of claim 1 wherein said identifying data includes a broadcast type code.

10. The method of claim 1 wherein said identifying data includes station location code.

11. The method of claim 1 wherein said identifying data includes a genre code.

12. The method of claim 1 wherein said identifying data includes a station alias code.

13. The method of claim 1 wherein said identifying data includes a program format code.

14. The method of claim 1 wherein said tuning is a seek function of said receiver.

15. The method of claim 1 wherein said tuning is a scan function of said receiver.

16. The method of claim 1 wherein said tuning is a frequency increment function of said receiver.

17. The method of claim 1 wherein said tuning is a preset memory function of said receiver.

18. A hybrid radio system for performing a fast tune in a radio receiver for a digital broadcast station, wherein said digital broadcast station provides a hybrid broadcast signal, wherein said hybrid broadcast signal contains an analog data signal and a digital data signal, wherein said analog data signal may contain an identifying data and said digital data signal contains an identifying data, wherein said identifying data relates to a station and programming content of said hybrid broadcast signal, said system comprising:

at least one tuner for receiving said hybrid broadcast signal, said at least one tuner selecting a target frequency channel of said hybrid broadcast signal;

an analog decoder for decoding said analog data signal to detect if said identifying data is present;

a digital decoder for decoding a digital data signal when said identifying data is not present in said analog data signal, wherein if said digital data signal is present, then said target frequency channel includes a digital main audio program; and a controller for causing said at least one tuner to select a next successive target frequency for detecting a next identifying data when neither identifying data of said analog or digital data signal are present.

19. The system of claim 18 further comprising a lookup table containing a stored identifying data corresponding to said target frequency channel for comparing with said identifying data on said hybrid broadcast signal for determining whether said target frequency channel includes said digital broadcast station selected.

20. The system of claim 18 wherein said analog decoder detects if said identifying data is present within a first predetermined period of time.

21. The system of claim 20 wherein said digital decoder decodes said digital data signal within a second predetermined period of time to determine if said digital data signal is present.

22. The method of claim 21 wherein said second predetermined time is greater than said first predetermined period of time.

23. The system of claim 18 wherein said identifying data from said analog data signal comprises RBDS data.

* * * * *